United States Patent
Peng et al.

(10) Patent No.: US 12,336,214 B2
(45) Date of Patent: Jun. 17, 2025

(54) INNER SPACERS FOR GATE-ALL-AROUND SEMICONDUCTOR DEVICES

(71) Applicant: Taiwan Semiconductor Manufacturing Co., Ltd., Hsinchu (TW)

(72) Inventors: Yu-Yun Peng, Hsinchu (TW); Fu-Ting Yen, Hsinchu (TW); Ting-Ting Chen, New Taipei (TW); Keng-Chu Lin, Ping-Tung (TW); Tsu-Hsiu Perng, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/395,058

(22) Filed: Dec. 22, 2023

(65) Prior Publication Data
US 2024/0136438 A1   Apr. 25, 2024

Related U.S. Application Data

(63) Continuation of application No. 17/201,673, filed on Mar. 15, 2021, now Pat. No. 11,855,214, which is a
(Continued)

(51) Int. Cl.
*H10D 30/62* (2025.01)
*H01L 21/02* (2006.01)
(Continued)

(52) U.S. Cl.
CPC ......... *H10D 30/62* (2025.01); *H01L 21/0217* (2013.01); *H01L 21/02203* (2013.01);
(Continued)

(58) Field of Classification Search
CPC .... H10D 30/62; H10D 30/024; H10D 64/017; H10D 64/018; H10D 64/021; H10D 30/6735; H10D 62/118; H10D 84/0147; H10D 84/038; H10D 62/85; H10D 30/014; H10D 30/43; H10D 30/6757; H10D 62/116; H10D 62/121; H10D 30/023; H10D 30/611; H10D 62/115; H10D 30/637; H01L 21/0217; H01L 21/02203; H01L 21/02211; H01L 21/0228; B82Y 10/00
See application file for complete search history.

(56) References Cited

U.S. PATENT DOCUMENTS 6,037,013 A   3/2000   Hsu
10,700,064 B1   6/2020   Zhang
(Continued)

*Primary Examiner* — Douglas W Owens
(74) *Attorney, Agent, or Firm* — HAYNES AND BOONE, LLP

(57) ABSTRACT

Semiconductor devices and methods of forming the same are provided. A semiconductor device according to the present disclosure includes a first semiconductor channel member and a second semiconductor channel member over the first semiconductor channel member and a porous dielectric feature that includes silicon and nitrogen. In the semiconductor device, the porous dielectric feature is sandwiched between the first and second semiconductor channel members and a density of the porous dielectric feature is smaller than a density of silicon nitride.

20 Claims, 14 Drawing Sheets

Related U.S. Application Data continuation of application No. 16/572,679, filed on Sep. 17, 2019, now Pat. No. 10,950,731.

(51) Int. Cl.

| | | |
|---|---|---|
| *H10D 30/01* | (2025.01) | |
| *H10D 30/67* | (2025.01) | |
| *H10D 62/10* | (2025.01) | |
| *H10D 64/01* | (2025.01) | |
| *H10D 84/01* | (2025.01) | |
| *H10D 84/03* | (2025.01) | |

(52) U.S. Cl.
CPC ......... *H10D 30/024* (2025.01); *H10D 64/017* (2025.01); *H10D 64/018* (2025.01); *H10D 64/021* (2025.01); *H10D 30/6735* (2025.01); *H10D 62/118* (2025.01); *H10D 84/0147* (2025.01); *H10D 84/038* (2025.01)

(56) References Cited

U.S. PATENT DOCUMENTS

| | | |
|---|---|---|
| 10,818,777 B2 | 10/2020 | Chiang |
| 2007/0077777 A1 | 4/2007 | Gumpher |
| 2010/0308383 A1 | 12/2010 | Shin |
| 2017/0200738 A1 | 7/2017 | Kim |
| 2018/0163130 A1 | 6/2018 | Kim |
| 2018/0277656 A1 | 9/2018 | Chao |
| 2019/0074224 A1 | 3/2019 | Xie |
| 2019/0081155 A1 | 3/2019 | Xie |
| 2019/0096996 A1* | 3/2019 | Song .................... H10D 62/151 |
| 2020/0006559 A1 | 1/2020 | Mehandru |
| 2020/0027959 A1* | 1/2020 | Cheng .................. H10D 64/679 |
| 2020/0044087 A1 | 2/2020 | Guha |
| 2020/0105751 A1 | 4/2020 | Dewey |
| 2020/0118892 A1 | 4/2020 | Cheng |
| 2020/0266060 A1 | 8/2020 | Cheng |
| 2020/0312956 A1 | 10/2020 | Yeh |

\* cited by examiner

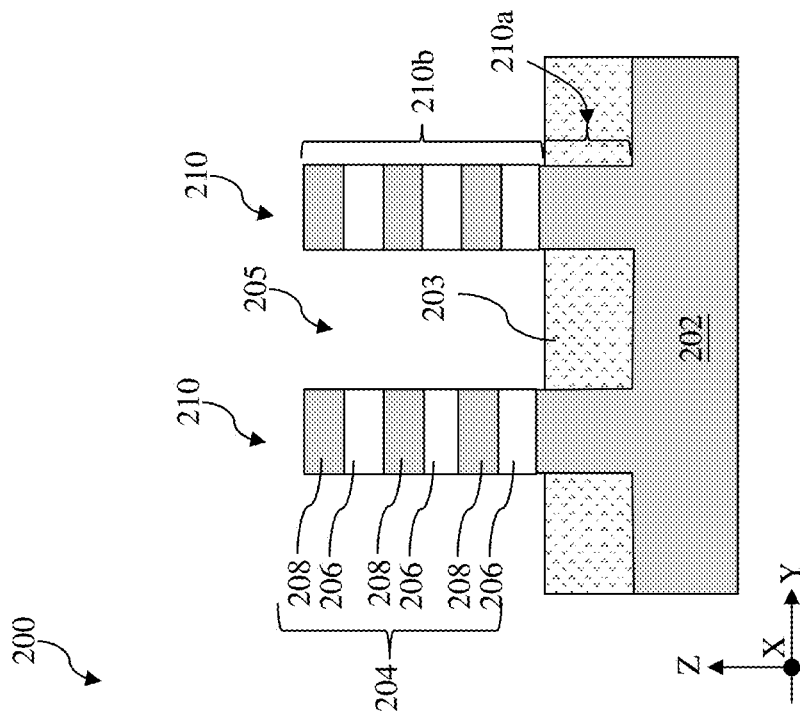
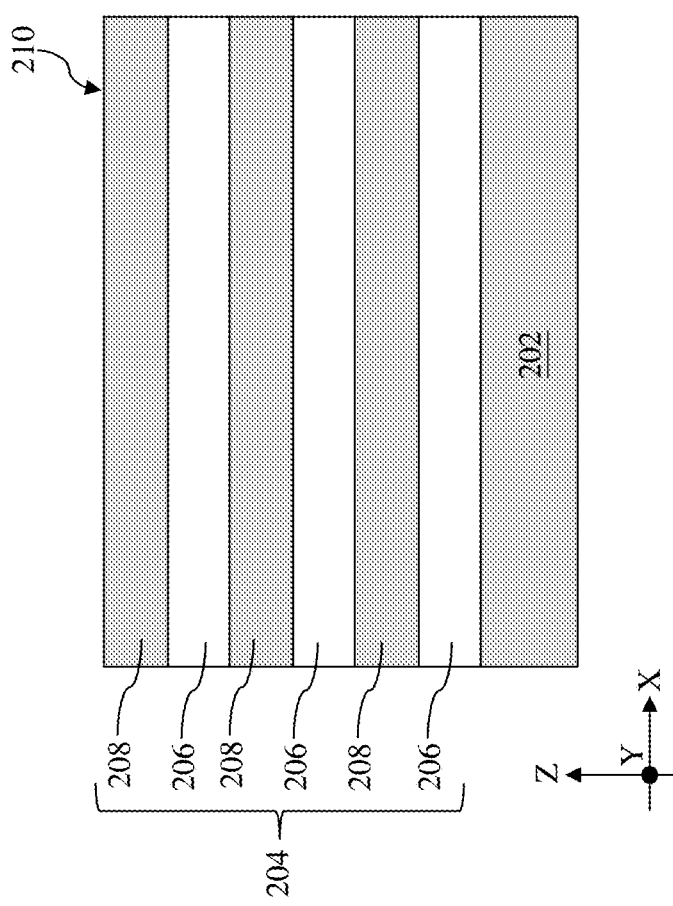
Fig. 2B
Fig. 2A

INNER SPACERS FOR GATE-ALL-AROUND SEMICONDUCTOR DEVICES

PRIORITY DATA

This application is a continuation application of U.S. patent application Ser. No. 17/201,673, filed Mar. 15, 2021, which is a continuation application of U.S. patent application Ser. No. 16/572,679, filed Sep. 17, 2019, each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanostructures (which extend horizontally, thereby providing horizontally-oriented channels) that are vertically stacked. Such GAA transistor can be referred to as a vertically-stacked horizontal GAA (VGAA) transistor.

In GAA devices, inner spacers have been used to reduce capacitance and leaking between gate structures and source/drain features. Although conventional GAA devices with inner spacers have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 3-6, 7A, 7B, 7C, and 8-12 illustrate fragmentary cross-sectional views of a workpiece during a fabrication process according to the method of FIG. 1, according to one or more aspects of the present disclosure.

DETAILED DESCRIPTION

Figure 1:
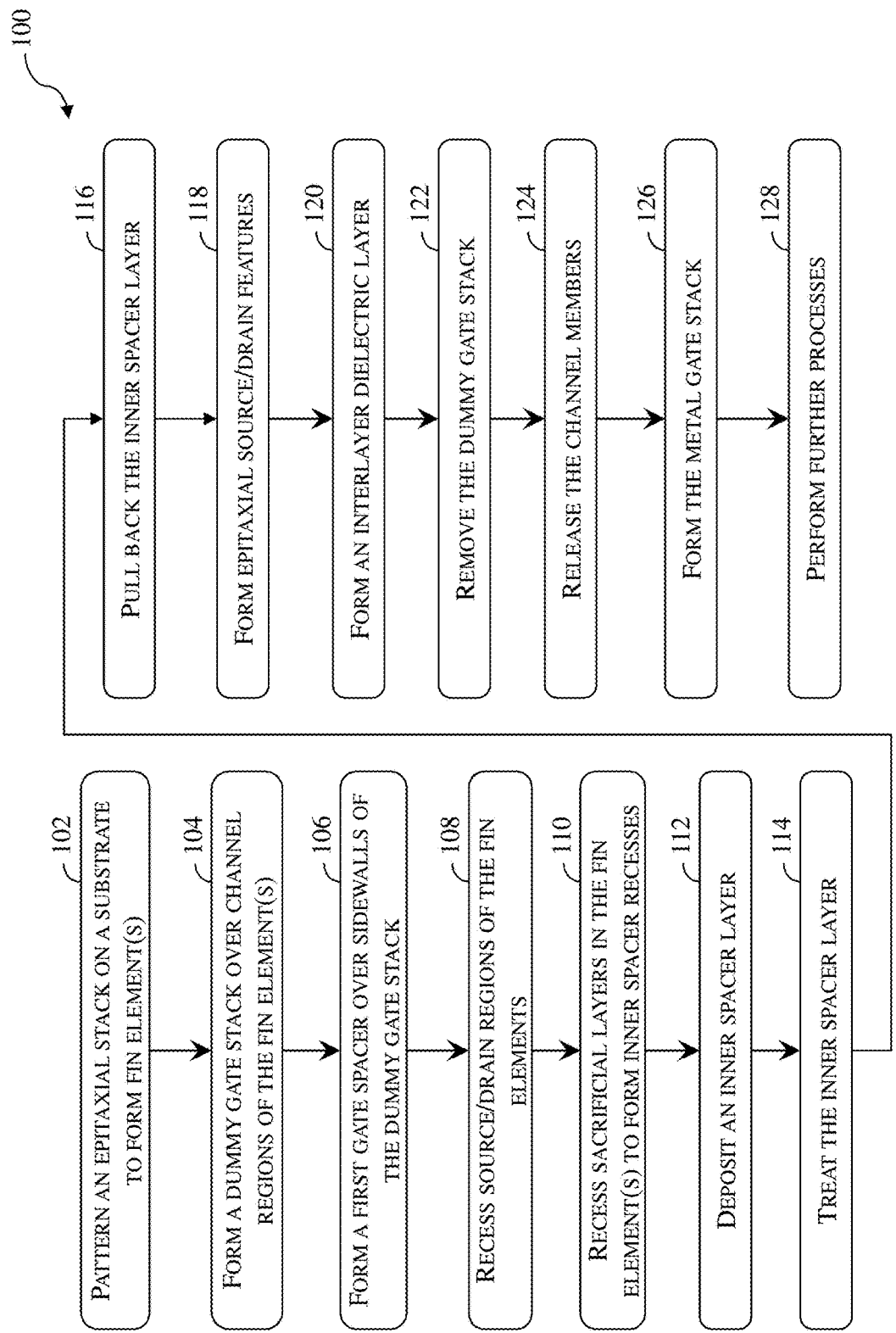
FIG. 1. Illustrates a flow chart of a method for forming a gate-all-around (GAA) device including inner spacer features, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to inner spacer formation when fabricating gate-all-around (GAA) transistors.

Multi-gate transistors include those transistors whose gate structures are formed on at least two-sides of a channel region. These multi-gate devices may include a p-type metal-oxide-semiconductor device or an n-type metal-oxide-semiconductor device. Examples of multi-gate transistors include FinFETs, on account of their fin-like structure and gate-all-around (GAA) devices. A GAA device includes any device that has its gate structure, or portion thereof, formed on 4-sides of a channel region (e.g., surrounding a portion of a channel region). Embodiments of the present disclosure may have channel regions disposed in nanowire channel(s), bar-shaped channel(s), nanosheet channel(s), nanostructure channel(s), column-shaped channel(s), post-shaped channel(s), and/or other suitable channel configurations. Devices according to the present disclosure may have one or more channel regions (e.g., nanowires, nanosheets, nanostructures) associated with a single, contiguous gate structure. However, one of ordinary skill would recognize that the teachings in the present disclosure may be applicable to a single channel (e.g., single nanowire, single nanosheet, or single nanostructure) or any number of channels. One of ordinary skill in art may recognize other examples of semiconductor devices that may benefit from aspects of the present disclosure.

As scales of the fin width in FinFETs decreases, channel width variations could cause undesirable variability and mobility loss. GAA transistors are being studied as an alternative to FinFETs. In a GAA transistor, the gate of the transistor is made all around the channel such that the channel is surrounded or wrapped by the gate. Such a transistor has the advantage of improving the electrostatic control of the channel by the gate, which also mitigates leakage currents. A GAA transistor includes various spacers, such as inner spacers and gate spacers (also termed as poly spacers, outer spacers, top spacers or main spacers). Inner spacers serve to reduce capacitance and prevent leaking between gate structure and source/drain features. The integration of inner spacers in a GAA transistor is not without its challenges. With respect to device performance, it is desirable to have inner spacers formed of low-k (low dielectric constant) dielectric material such as silicon oxide rather than high-k dielectric material such as silicon nitride because low-k inner spacers may reduce parasitic capacitance. In terms of process integration, inner spacer layers are usually not formed of just silicon oxide because formation of silicon oxide layers involves oxidization process that may also oxidize silicon and germanium in the epitaxial stack and result in defects. In terms of etching selectivity, while an inner spacer layer may be formed of silicon nitride, a silicon nitride inner spacer cannot be selectively removed in inner spacer layer pull-back process, without substantially damaging gate spacer layers formed on sidewalls of dummy gate structures. The inner spacer feature according to the present disclosure is formed by depositing an inner spacer layer by ALD using an organosilane precursor and a nitrogen-containing gas, treating the inner spacer layer, and then etching back the treated inner spacer layer. The inner spacer feature formed using methods of the present disclosure includes a porous silicon nitride material. The porous silicon nitride material may include a dielectric constant lower than that of silicon nitride, be formed of a process that does not damage the epitaxial stack, and have an etch selectivity with respect to the gate spacers. The construction and composition of the inner spacer feature of the present disclosure therefore may enlarge the process window of the inner spacer formation process and improve device performance.

Illustrated in FIG. 1 is a method 100 of forming a semiconductor device, such as a multi-gate device. As used herein, the term "multi-gate device" is used to describe a device (e.g., a semiconductor device) that has at least some gate material disposed on multiple sides of at least one channel of the device. In some examples, the multi-gate device may be referred to as a GAA device having gate material disposed on at least four sides of at least one channel of the device. The channel region may be referred to as a nanowire, nanosheet, nanostructure, channel member, semiconductor channel member, which as used herein includes channel regions of various geometries (e.g., cylindrical, bar-shaped, sheet-shaped) and various dimensions.

As with the other method embodiments and exemplary devices discussed herein, it is understood that parts of the workpiece 200 illustrated in FIGS. 2A, 2B, 3-6, 7A, 7B, 7C, and 8-12 may be fabricated by a CMOS technology process flow, and thus some processes are only briefly described herein. Upon conclusion of the fabrication process, the workpiece 200 will be turned into a semiconductor device 200. In that sense, the workpiece 200 and the semiconductor device 200 may be used interchangeably. Further, the exemplary semiconductor devices may include various other devices and features, such as other types of devices including additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including n-type GAA transistors, p-type GAA transistors, PFETs, NFETs, etc., which may be interconnected. Moreover, it is noted that the process steps of method 100, including any descriptions given with reference to FIGS. 2A, 2B, 3-6, 7A, 7B, 7C, and 8-12, as with the remainder of the method and exemplary figures provided in this disclosure, are merely exemplary and are not intended to be limiting beyond what is specifically recited in the claims that follow.

Referring to FIGS. 1, 2A and 2B, the method 100 includes block 102 where an epitaxial stack 204 on a substrate 202 is patterned to form fin elements 210. FIG. 2A illustrates a fragmentary cross-sectional view of a workpiece 200 along the X direction, the length-wise direction of the fin elements 210 while FIG. 2B illustrates a fragmentary cross-sectional view of the workpiece along the Y direction that runs across the fin elements 210. In some embodiments, the substrate 202 of the workpiece 200 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type GAA transistors, p-type GAA transistors). The suitable doping may include ion implantation of dopants and/or diffusion processes. The substrate 202 may have isolation features interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features. In an embodiment of the method 100, an anti-punch through (APT) implant is performed. The APT implant may be performed in a region underlying the channel region of a device for example, to prevent punch-through or unwanted diffusion.

In some embodiments, the epitaxial stack 204 formed over the substrate 202 includes epitaxial layers 206 of a first composition interposed by epitaxial layers 208 of a second composition. The first and second composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, the epitaxial layers 206 include SiGe and the epitaxial layers 208 include Si. In those embodiments, the germanium content in the epitaxial layers 206 may be between about 15% and about 40%.

It is noted that three (3) layers of the epitaxial layers 206 and three (3) layers of the epitaxial layers 208 are alternately arranged as illustrated in FIG. 2, which is for illustrative purposes only and not intended to be limiting beyond what is specifically recited in the claims. It can be appreciated that any number of epitaxial layers can be formed in the epitaxial stack 204. The number of layers depends on the desired number of channels members for the device 200. In some embodiments, the number of epitaxial layers 208 is between 2 and 10.

In some embodiments, each epitaxial layer 206 has a thickness ranging from about 2 nanometers (nm) to about 6 nm, such as 3 nm in a specific example. The epitaxial layers 206 may be substantially uniform in thickness. In some embodiments, each epitaxial layer 208 has a thickness ranging from about 6 nm to about 12 nm, such as 9 nm in a specific example. In some embodiments, the epitaxial layers 208 of the epitaxial stack 204 are substantially uniform in thickness. As described in more detail below, the epitaxial layers 208 or parts thereof may serve as channel member(s) for a subsequently-formed multi-gate device and the thickness is chosen based on device performance considerations. The epitaxial layers 206 in channel regions(s) may eventually be removed and serve to define a vertical distance between adjacent channel region(s) for a subsequently-formed multi-gate device and the thickness is chosen based on device performance considerations. Accordingly, the epitaxial layers 206 may also be referred to as sacrificial layers 206, and epitaxial layers 208 may also be referred to as channel layers 208.

By way of example, epitaxial growth of the layers of the epitaxial stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 208 include the same material as the substrate 202. In some embodiments, the epitaxially grown layers 206 and 208 include a different material than the substrate 202. As stated above, in at least some examples, the epitaxial layers 206 include an epitaxially grown silicon germanium (SiGe) layer and the epitaxial layers 208 include an epitaxially grown silicon (Si) layer. Alternatively, in some embodiments, either of the epitaxial layers 206 and 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206 and 208 may be chosen based on providing differing oxidation, etching selectivity properties. In some embodiments, the epitaxial layers 206 and 208 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

At block 102, the epitaxial stack 204 over the substrate 202 is patterned to form the fin elements 210 that extend from the substrate 202 and span along the X direction. It is noted that FIG. 2A, as well as FIGS. 3-6, 7A, 7B, 7C, and 8-12, only show fragmentary cross-section views that may not necessarily show the entire length of the fin element 210. In some embodiments illustrated in FIG. 2B, the patterning also etches into the substrate 202 such that each of the fin elements 210 includes a lower portion 210a formed from the substrate 202 and an upper portion 210b from the epitaxial stack 204. The upper portion 210b includes each of the epitaxial layers of the epitaxial stack 204 including epitaxial layers 206 and 208. The fin elements 210 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin elements 210 by etching the epitaxial stack 204. The etching process can include dry etching, wet etching, reactive ion etching (RIE), and/or other suitable processes.

As shown in FIG. 2, block 102 of the method 100 includes operations where shallow trench isolation (STI) feature 203 is formed between adjacent fin elements 210. By way of example, in some embodiments, a dielectric layer is first deposited over the substrate 202, filling the trenches 205 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an atomic layer deposition (ALD) process, a physical vapor deposition (PVD) process, and/or other suitable process. The deposited dielectric material is then thinned and planarized, for example by a chemical mechanical polishing (CMP) process. The planarized dielectric layer is further recessed by a dry etching process, a wet etching process, and/or a combination thereof to form the STI features 203. The fin elements 210 rise above the STI features 203. In some embodiments, the dielectric layer (and the subsequently formed STI features 203) may include a multi-layer structure, for example, having one or more liner layers.

Although not shown, in some embodiments, dielectric fins may be formed at block 102 of method 100. In those embodiments, after the dielectric material is deposited to form the dielectric layer, the dielectric layer is patterned to form slits that extend in parallel with the fin elements 210. Material for the dielectric fins is then deposited over the workpiece 200 to fill the slits. The material for the dielectric fins is different from the dielectric material that forms the STI features 203. That allows the dielectric layer for the STI features 203 to be selectively etched when the dielectric layer is recessed, leaving behind the dielectric fins that also rise above the STI features 203. In some embodiments, the material for the dielectric fins may include silicon nitride, silicon carbonitride, silicon carbide, aluminum oxide, zirconium oxide, or other suitable materials. The dielectric fins interpose between the fin elements 210 and serve to separate source/drain features of neighboring devices. The dielectric fins may also be referred to as dummy fins or hybrid fins. In some alternative embodiments, an upper portion of the dielectric fins may be removed during a gate cut process and replaced by a dielectric material that may be different or similar to that of the dielectric fins.

Figure 3:
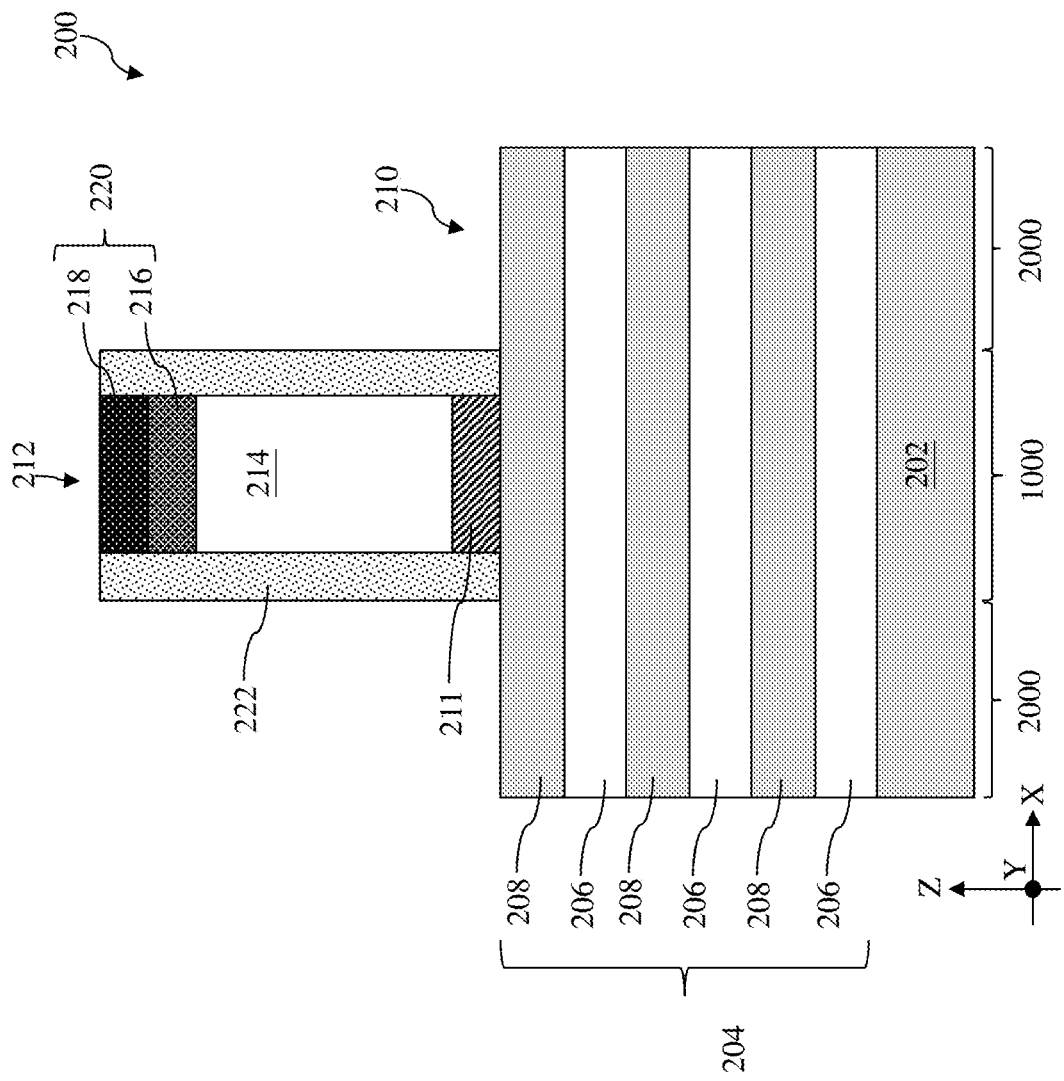

Referring to FIGS. 1 and 3, the method 100 includes a block 104 where a dummy gate stack 212 is formed over a channel region 1000 of the fin element 210. In some embodiments, a gate replacement or gate-last process is adopted that the dummy gate stack 212 serves as a placeholder for a high-k metal gate stack and is to be remove and replaced by the high-k metal gate stack. Other processes and configuration are possible. In some embodiments, the dummy gate stack 212 is formed over the substrate 202 and is at least partially disposed over the fin elements 210. The portion of the fin elements 210 underlying the dummy gate stack 212 is the channel region 1000. The dummy gate stack 212 may also define source/drain (S/D) regions 2000 adjacent to and on opposing sides of the channel region 1000.

In the illustrated embodiment, block 104 first forms a dummy dielectric layer 211 over the fin elements 210. In some embodiments, the dummy dielectric layer 211 may include silicon oxide, silicon nitride, a high-K dielectric material and/or other suitable material. In various examples, the dummy dielectric layer 211 may be deposited by a CVD process, a subatmospheric CVD (SACVD) process, a flowable CVD process, an ALD process, a PVD process, or other suitable process. By way of example, the dummy dielectric layer 211 may be used to prevent damages to the fin elements 210 by subsequent processes (e.g., subsequent formation of the dummy gate stack). Subsequently, block 104 forms other portions of the dummy gate stack 212, including a dummy electrode layer 214 and a hard mask 220 which may include multiple layers 216 and 218. In some embodiments, the dummy gate stack 212 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy electrode layer 214 may include polycrystalline silicon (polysilicon). In some embodiments, the hard mask 220 includes an oxide layer 216 such as a pad oxide layer that may include silicon oxide. In some embodiments, hard mask 220 includes the nitride layer 218 such as a pad nitride layer that may include silicon nitride, silicon oxynitride and/or silicon carbide.

Still referring to FIG. 3, in some embodiments, after formation of the dummy gate stack 212, the dummy dielectric layer 211 is removed from the source/drain regions 2000 of the fin elements 210. That is, the dummy dielectric layer 211 that is not covered by the dummy electrode layer 214 is removed. The removal process may include a wet etch, a dry etch, and/or a combination thereof. The etch process is chosen to selectively etch the dummy dielectric layer 211 without substantially etching the fin elements 210, the hard mask 220, and the dummy electrode layer 214.

Referring to FIGS. 1 and 3, the method 100 includes a block 106 where gate spacers 222 are formed over sidewalls of the dummy gate stack 212. In some embodiments, spacer material for forming the gate spacers is deposited conformally over the workpiece 200, including over top surfaces and sidewalls of the dummy gate stack 212, to form a spacer material layer. The term "conformally" may be used herein for ease of description of a layer having substantially uniform thickness over various regions. The spacer material may include a dielectric material such as silicon oxide, silicon nitride, silicon carbide, silicon oxynitride, silicon carbonitride, silicon oxycarbide, silicon oxycarbonitrde, and/or combinations thereof. In some embodiments, the spacer material layer includes multiple layers, such as main spacer walls, liner layers, and the like. The spacer material may be deposited over the dummy gate stack 212 using processes such as, CVD process, a subatmospheric CVD (SACVD) process, a flowable CVD process, an ALD process, a PVD process, or other suitable process. The spacer material layer is then etched back in an anisotropic etch process to form the gate spacers 222. The anisotropic etch process exposes portions of the fin elements 210 adjacent to and not covered by the dummy gate stack 212 (e.g., in source/drain regions). Portions of the spacer material layer directly above the dummy gate stack 212 may be completely removed by this anisotropic etching process while the gate spacers 222 remain on sidewalls of the dummy gate stack 212. In some implementations when the gate spacers 222 are formed of silicon nitride or silicon carbonitride, the gate spacers 222 have a density greater than 2.8 g/cm$^3$.

Figure 4:
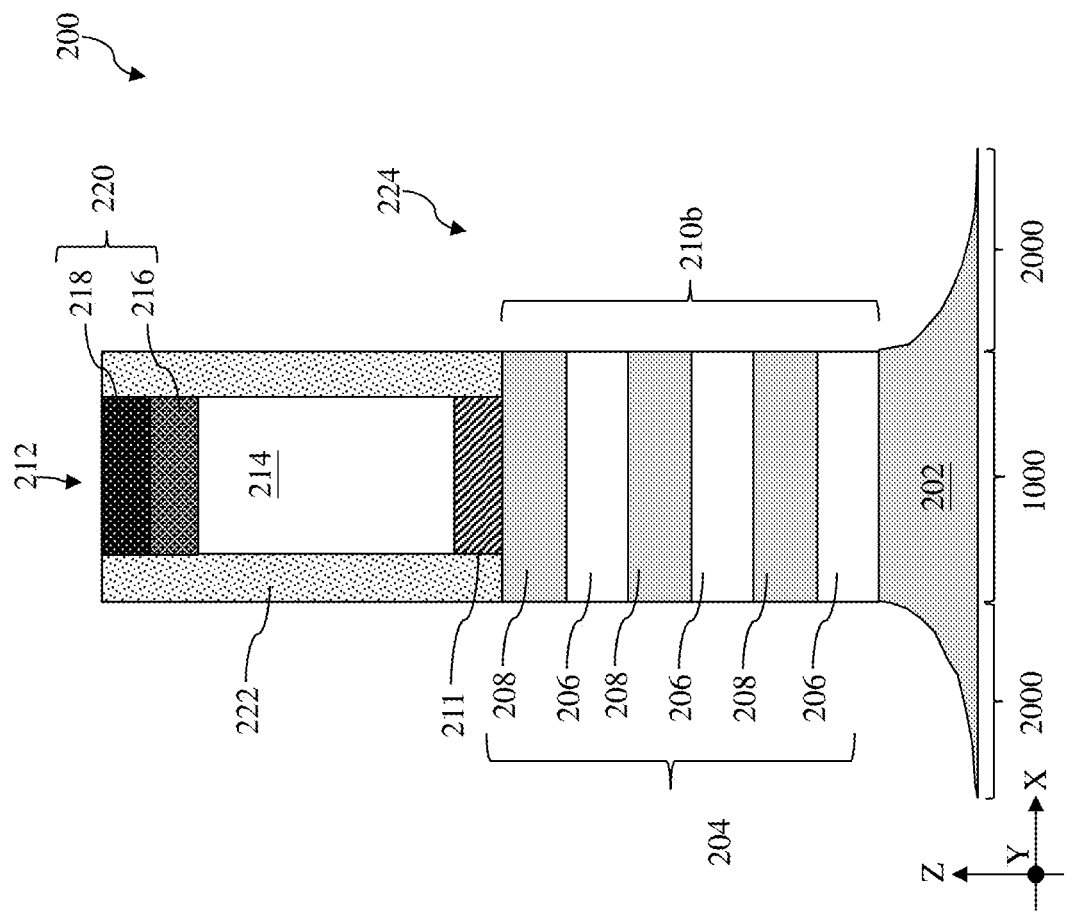

Referring to FIGS. 1 and 4, the method 100 includes a block 108 where source/drain regions 2000 of the fin elements 210 are recessed. In some embodiments, the portions of the fin elements 210 that are not covered by the dummy gate stack 212 and the gate spacers 222 are etched by a dry etch or a suitable etching process to form source/drain trench 224. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments represented in FIG. 4, the upper portion 210b of the fin element 210 is recessed to expose the sacrificial layers 206 and the channel layers 208. In some implementations, at least a portion of the lower portion 210a of the fin elements 210 are recessed as well. That is, the source/drain trench 224 may extend below the bottom-most sacrificial layer 206.

Figure 5:
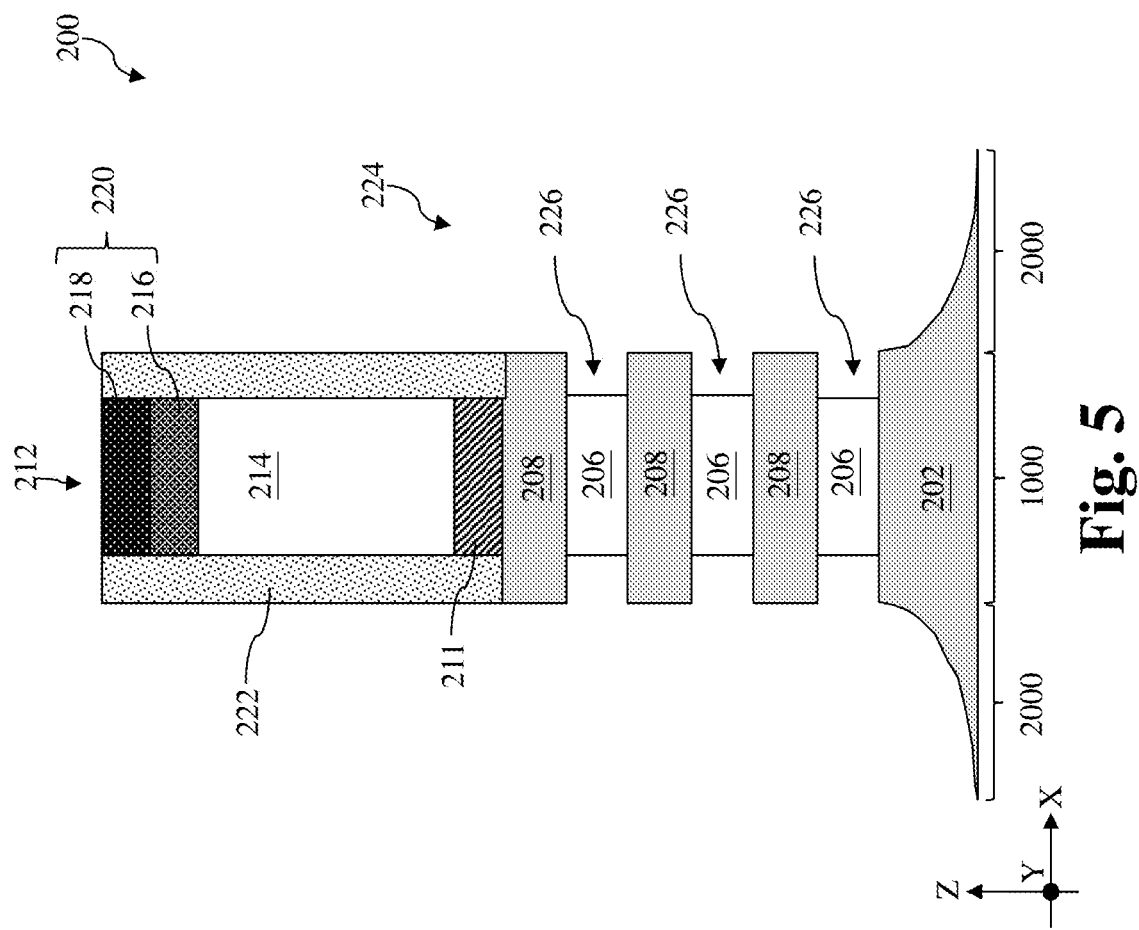

Referring to FIGS. 1 and 5, the method 100 includes a block 110 where the sacrificial layers 206 in the fin elements 210 are recessed. In some embodiments represented in FIG. 5, the sacrificial layers 206 exposed in the source/drain trench 224 are selectively and partially recessed to form inner spacer recesses 226 while the exposed channel layers 208 are substantially unetched. In an embodiment where the channel layers 208 consist essentially of Si and sacrificial layers 206 consist essentially of SiGe, the selective recess of the sacrificial layers 206 may include a SiGe oxidation process followed by a SiGe oxide removal. In those embodiments, the SiGe oxidation process may include use of ozone. In some embodiments, the selective recess may be a selective isotropic etching process (e.g., a selective dry etching process or a selective wet etching process), and the extent the sacrificial layers 206 are recessed is controlled by duration of the etching process. In some embodiments, the selective wet etching process may include a hydro fluoride (HF) or $NH_4OH$ etchant. As shown in FIG. 5, the inner spacer recesses 226 extend laterally inward into the fin element 210 from the source/drain trench 224.

Figure 6:
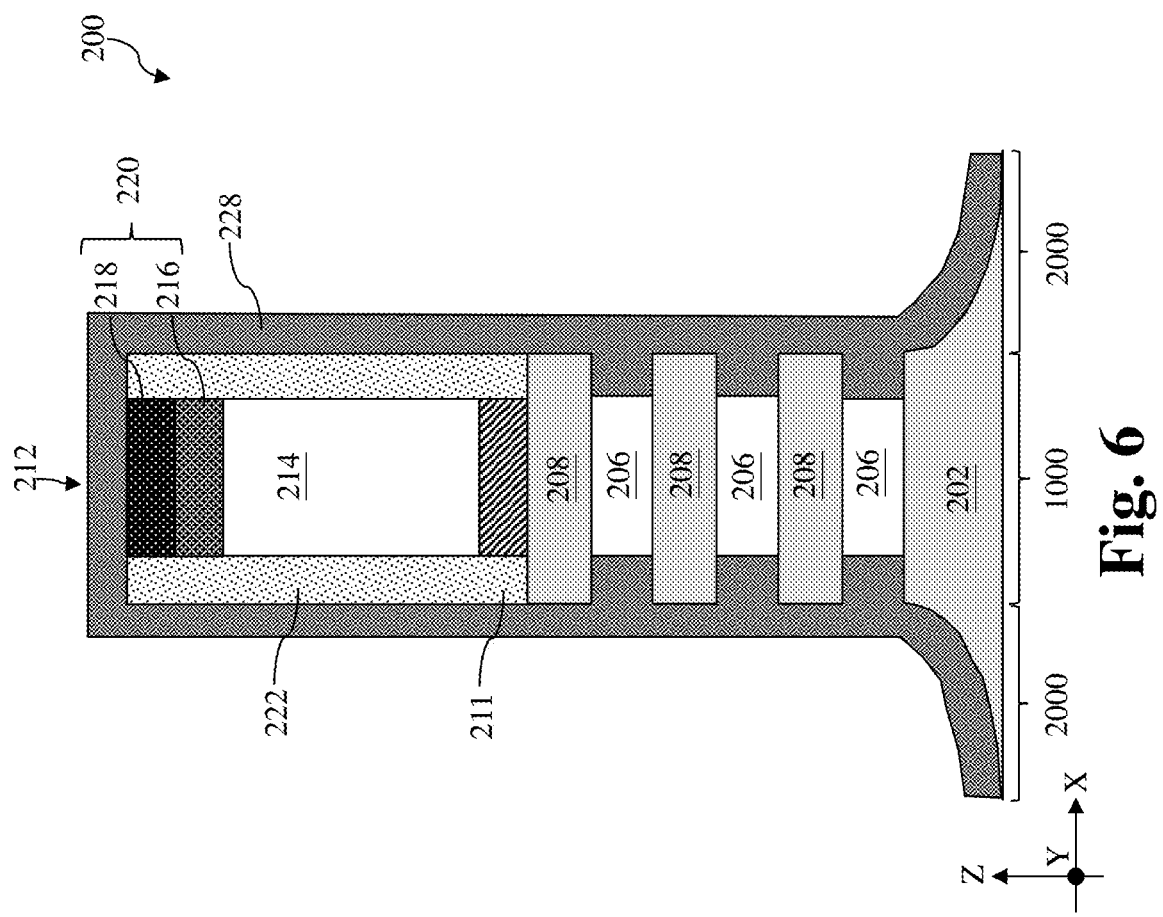

Referring to FIGS. 1 and 6, the method 100 includes a block 112 where an inner spacer layer 228 is deposited over the workpiece 200, including within the inner spacer recesses 226. The inner spacer layer 228 may be conformally deposited by CVD, PECVD, LPCVD, ALD or other suitable method. In some embodiments, the inner spacer layer 228 is a porous silicon-nitride based dielectric layer deposited by an ALD process in a furnace, a single wafer chamber, or a rotary apparatus. In some implementations, the ALD process may include use of one or more organosilane precursors that include silicon and an alkyl group. According to the present disclosure, the one or more organosilane precursors may include a crosslinking precursor and a porogen precursor. For the purpose of this disclosure, a crosslinking precursor includes a silicon-carbon-silicon (Si—C—Si) chain where a carbon atom is covalently bonded to two silicon atoms; and a porogen precursor includes silicon, nitrogen, and terminal alkyl groups bonded to the silicon and nitrogen atoms. A porogen precursor does not include any silicon-carbon-silicon chains.

A crosslinking precursor may or may not include a halide group. In some instance where the crosslinking precursor includes a halide group, a molecule of the crosslinking precursor may have a chemical formula $Si(CH_2)SiR_xCl_y$, where R may be a hydrogen atom or an alkyl group such as a methyl group, X is greater than zero, Y is greater than 1, and a sum of X and Y is 6. An example is dichlorotetramethyldisilane $(SiCH_2Si(CH_3)_4Cl_2)$ shown below.

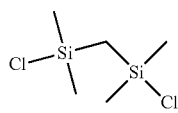

In another example, a halide-containing crosslinking precursor may also have a chemical formula $Si(CH_2)_2SiR)_xCl_y$, where R may be a hydrogen atom or an alkyl group such as a methyl group, X is greater than zero, Y is greater than 1, and a sum of X and Y is 4. An example is $Si(CH_2)_2SiCl_4$ shown below.

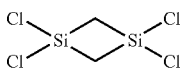

In yet another example, a halide-containing crosslinking precursor may have a chemical formula $Si(CH_3)_xCl_y$, where X is greater than 1 and a sum of X and Y is 4. An example is dimethyldichlorosilane $(Si(CH_3)_2Cl_2)$ shown below.

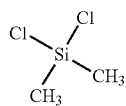

In some embodiments, the crosslinking precursor may not include any halide groups. In these embodiments, the crosslinking precursor may have a chemical formula $Si(CH_2)Si(CH_3)_xCl_y$, where X is greater than zero, Y is greater than 2, and a sum of X and Y is 6. Examples may include disilylmethane $(SiCH_2SiH_6)$ and tetramethyldisilane $(SiCH_2Si(CH_3)_4H_2)$ shown below.

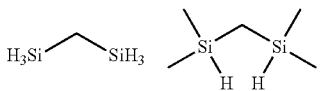

In some other instances, a porogen precursor have a chemical formula $SiH_x(R1)_y(R2)_z$, where R1 may be an alkyl group such as a methyl group, R2 may be an amino group such as a methylamino group $NH(CH3)$ or a dimethylamino group $N(CH3)2$, X is greater than zero, Y is greater than 1, Z is greater than 1, and a sum of X, Y and Z is 4. It is noted that the R1 and R2 include a terminal alkyl group (i.e. $CH_3$) that tends to increase carbon contents and increase porosity but is unlikely to facilitate crosslinking among different precursors. Examples may include Bis(dimethylamino)dimethylsilane $(Si(CH_3)_2(N(CH_3)_2)_2)$ and dimethylamino dimethylsilane $(SiH(CH_3)(NH(CH_3))_2)$ shown below.

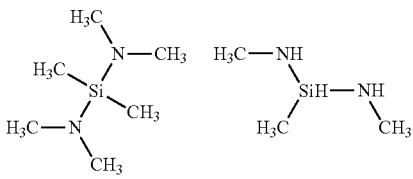

Besides one or more organosilane precursors, a reactant gas and a carrier gas may be used in the ALD process. Examples of the reactant gas may include a nitrogen-containing gas, such as ammonia, nitrogen, or hydrogen, or a combination thereof. Examples of the carrier gas may include nitrogen, helium or argon. In some embodiments, the ALD process is a thermal ALD process and performed at a temperature between about 150° C. and about 650° C. In some embodiments, the inner spacer layer 228 is characterized by a step coverage greater than 95% and substantially fills the inner spacer recesses 226.

The crosslinking precursors may increase crosslinking density and improve integrity of the inner spacer layer 228. In addition, the crosslinking precursor may strengthen attachment of the inner spacer layer 228 to the sacrificial layers 206. The terminal alkyl groups of the porogen precursors may increase porosity and carbon content of the inner spacer layer 228. By increasing carbon content, the porogen precursors may improve etch resistance of the inner spacer layer 228. In some embodiments, at least one type of crosslinking precursor and at least one type of porogen precursors are used at block 112 to deposit the inner spacer layer 228. According to the present disclosure, the precursors, reactant gases, and carrier gases used at block 112 do not include oxygen or oxidizers and as a result, the operations at block 112 do not run the risk of oxidizing the epitaxial layers 206 and 208 of the epitaxial stack 204. This, however, does not mean that the resultant inner spacer layer 228 does not include oxygen atoms. It has been observed that oxygen in ambient air may enter the lattice of the inner spacer layer 228 and oxidize the inner spacer layer 228, when vacuum is broken and the workpiece 200 is removed from a vacuum chamber. The oxygen content in the inner spacer layer 228 may depend on the deposition temperature at block 112. When the temperature of the depositon process at block 112 is above 500° C., such as between about 500° C. and about 650° C., more nitrogen atoms are incorporated in the inner spacer layer 228 and less reaction sites are available for oxygen atoms in the ambient air. When more nitrogen atoms are incorporated into the inner spacer layer 228, the inner spacer layer 228 may have a higher dielectric constant as its electrical property is closer to that of nonporous silicon nitride with a dielectric constant of about 7. Similarly, when more nitrogen atoms are incorporated into the inner spacer layer 228, the inner spacer layer 228 may have a higher density as its lattice structure is closer to that of non-porous silicon nitride with a density of about 2.8 g/cm$^3$ or more. When the temperature of the depositon process at block 112 is below 500° C., such as between about 150° C. and about 350° C., less nitrogen atoms are incorporated in the inner spacer layer 228 and more areaction sites are available for oxygen atoms in the ambient air. When more oxygen atoms are allowed to enter the lattice of the inner spacer layer 228, the inner spacer layer 228 may have a lower dielectric constant as its electrical property is closer to that of silicon oxide with a dielectric constant of about 3.9. Similarly, when more oxygen atoms are allowed to enter the lattice of the inner spacer layer 228, the inner spacer layer 228 may have a lower density as its lattice structure is closer to that of non-porous silicon oxide with a density of about 2.2 g/cm$^3$ or more.

Some embodiments are provided below as examples. In one embodiment, the halide-containing crosslinking precursor $Si(CH_2)_2SiCl_4$ is used to deposit the inner spacer layer 228 at a temperature between about 500° C. and about 650° C. For the ease of reference, the resultant inner spacer layer 228 may be referred to as the first inner spacer layer. As the deposition temperature is on the higher end of the disclosed range, the inner spacer layer may have a dielectric constant between about 4.9 and about 5.2, a density between about 2.1 g/cm$^3$ and about 2.3 g/cm$^3$, a nitrogen content between about 30% and about 40%, and a carbon content between about 3% and about 8%. In another embodiment, the porogen precursor $Si(CH_3)_2(N(CH_3)_2)_2$ is used to deposit the inner spacer layer 228 at a temperature between about 150° C. and about 350° C. For the ease of reference, the resultant inner spacer layer 228 may be referred to as the inner spacer layer. As the deposition temperature is on the lower end of the disclosed range, the inner spacer layer may have a dielectric constant between about 3.7 and about 4.2, a density between about 1.7 g/cm$^3$ and about 2.0 g/cm$^3$, a nitrogen content between about 4% and about 8%, and a carbon content between about 5% and about 10%. Conventionally, a low-k dielectric material refers to a dielectric material with a dielectric constant smaller than 3.9, which is the dielectric constant of silicon oxide. It is noted that the inner spacer layer 228 in embodiments of the present disclosure has a dielectric constant between about 3.7 and about 5.2, which is smaller than the dielectric constant of silicon nitride but is, for the most part, greater than 3.9. Therefore, the inner spacer layer 228 in embodiments of the present disclosure may be regarded as having a relatively low dielectric constant, as opposed to the low-k material according to the conventional definition.

Figure 7A:
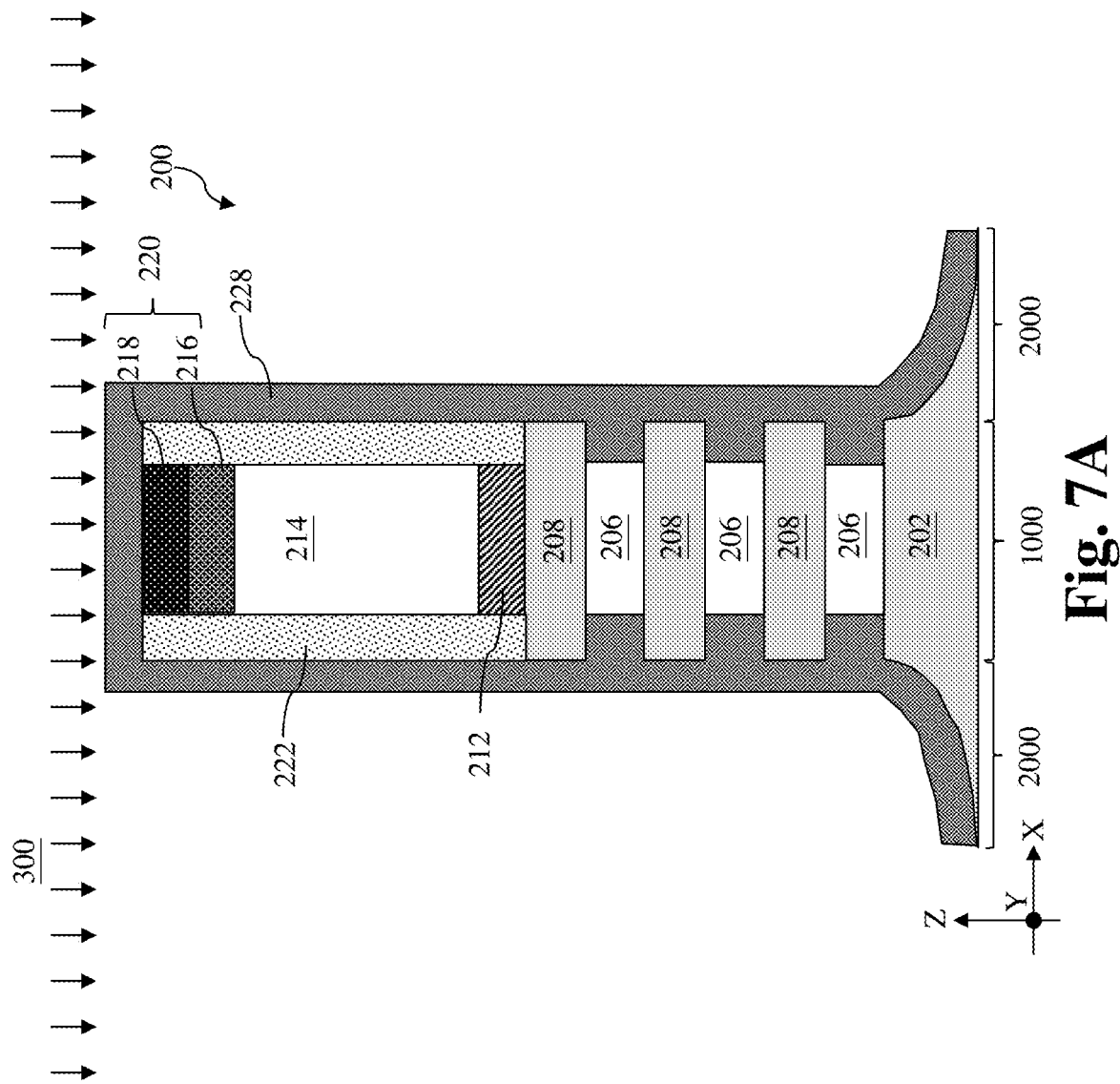
Figure 7B:
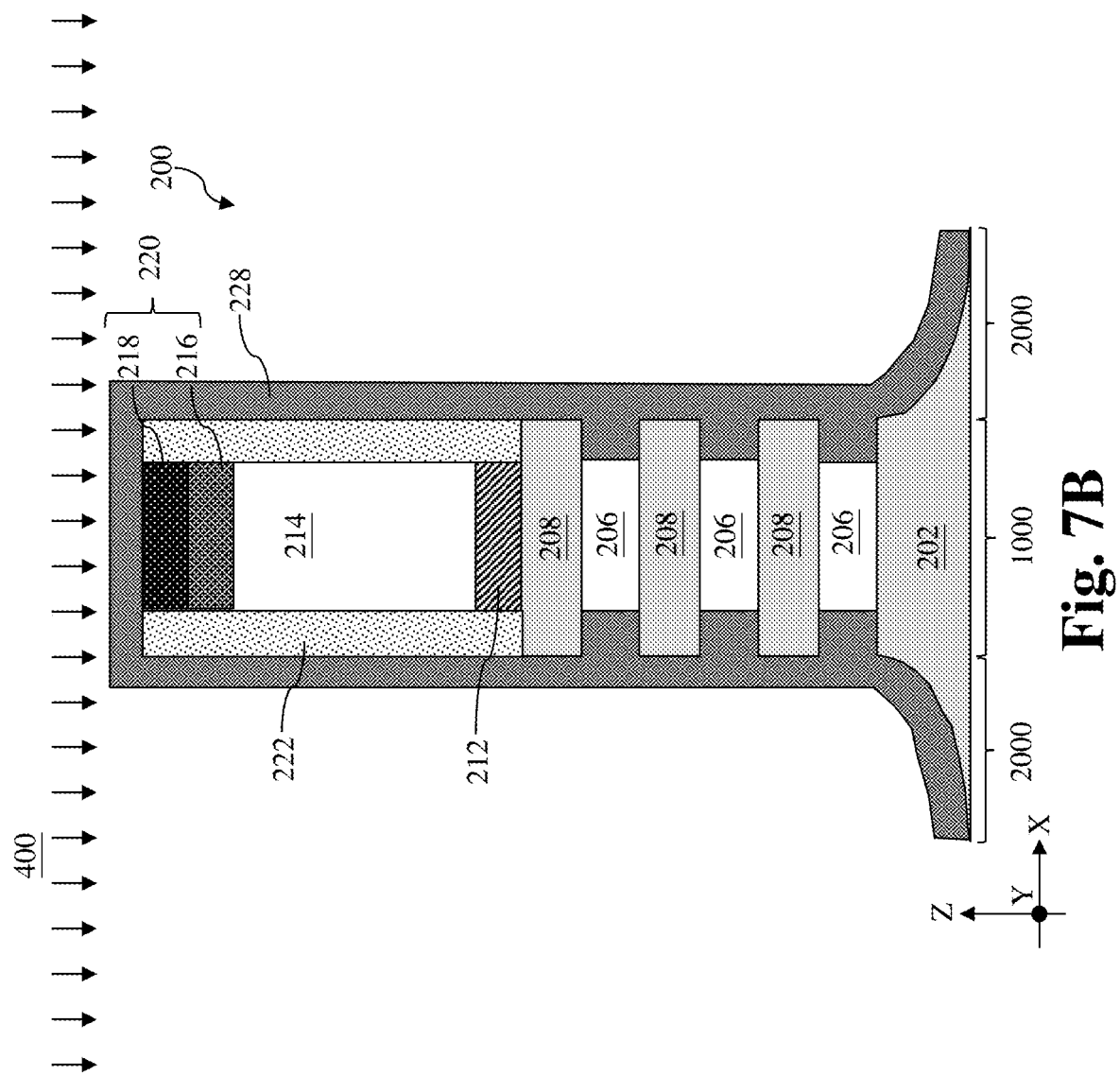
Figure 7C:
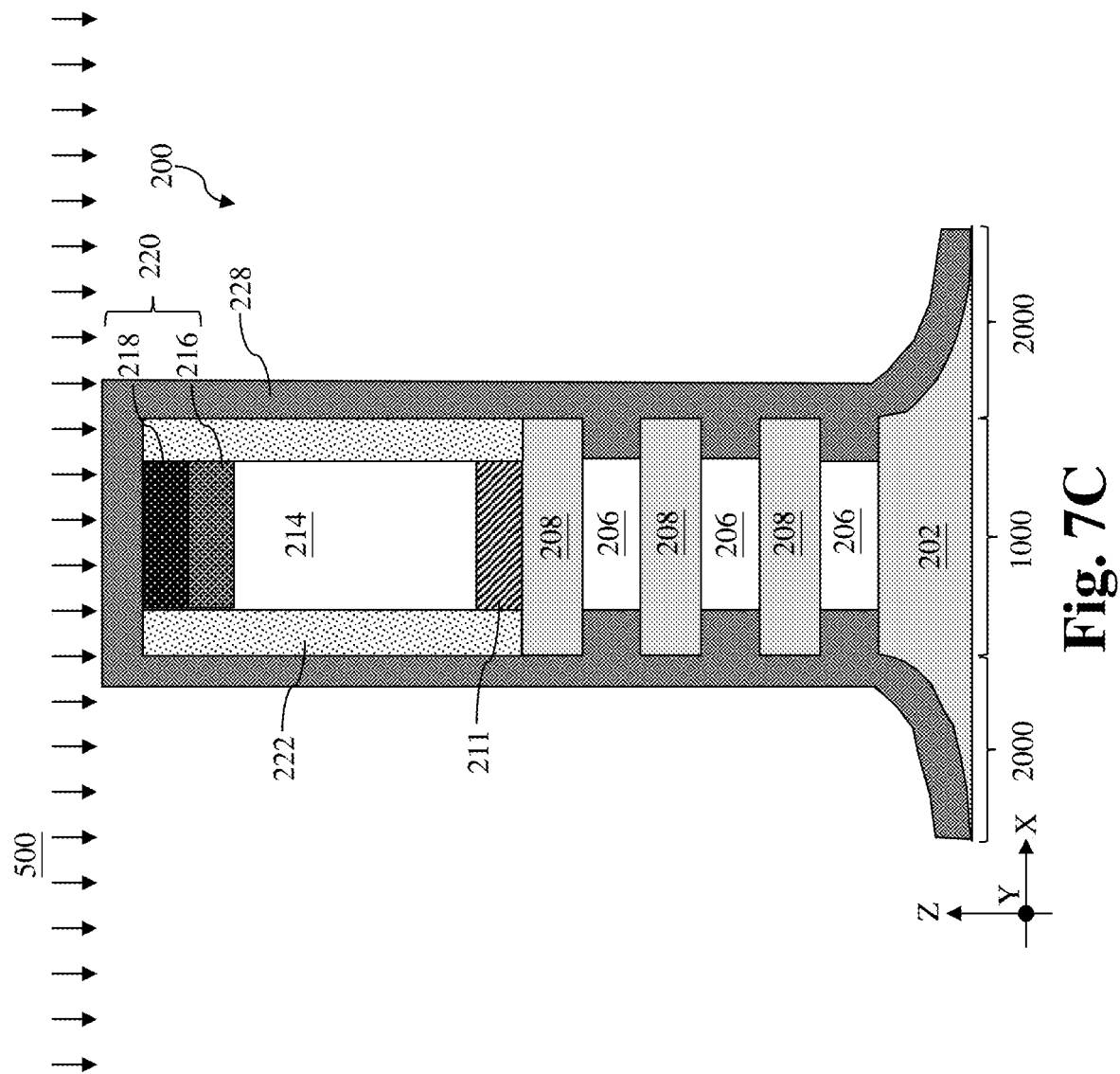

Referring to FIGS. 1, 7A, 7B, and 7C, the method 100 includes a block 114 where the inner spacer layer 228 is treated by a treatment process. FIGS. 7A, 7B and 7C illustrate three embodiments of the treatment process. In some embodiments represented in FIG. 7A, the treatment process may be an anneal process 300, which may be a furnace anneal process, a laser anneal process, a flash anneal process, a rapid thermal anneal (RTA) process, a suitable anneal process, or a combination thereof. In some implementations, the anneal process 300 includes an anneal temperature between about 350° C. and about 700° C. and an ambient including helium, argon, nitrogen, hydrogen, an inert gas, or a combination thereof. In some embodiments represented in FIG. 7B, the treatment process may be an ultraviolet (UV) curing process 400, which includes irradiating a UV radiation at the inner spacer layer 228. In some implementations, the UV curing process 400 includes a curing temperature between 150° C. and about 450° C. and an ambient containing helium, argon, nitrogen, hydrogen, an inert gas, or a combination thereof. In some embodiments represented in FIG. 7C, the treatment process may be a remote plasma treatment process 500, which includes allowing a remotely generated plasma of helium, hydrogen, nitrogen or argon to interact with the as-deposited inner spacer layer 228. In some implementations, the remote plasma treatment process 500 includes a process temperature between about room temperature (i.e. between about 20° C. and about 25° C.) and about 350° C.

The treatment process at block 114 of the method 100 may function to cure the as-deposited inner spacer layer 228 and remove residual gas in the porous inner spacer layer 228. In some embodiments, the treatment process at block 114 may facilitate polymerization reaction to increase crosslinking density and remove unreacted species in the inner spacer layer 228. Thus, the treatment process at block 114 may strengthen the inner spacer layer 228. In some embodiments, the treatment process at block 114 may detach and remove gas species, such as ammonia, nitrogen or oxygen absorbed on the porous inner spacer layer 228. It has been observed that while the treatment process at block 114 cure the inner spacer layer 228 and remove the residual gas absorbed in the inner spacer layer 228, it does not materially change the property and structure of the inner spacer layer 228. That is, the foregoing descriptions about the density, dielectric constant, and composition of the pre-treatment inner spacer layer 228 still hold true with respect to the treated inner spacer layer 228.

Figure 8:
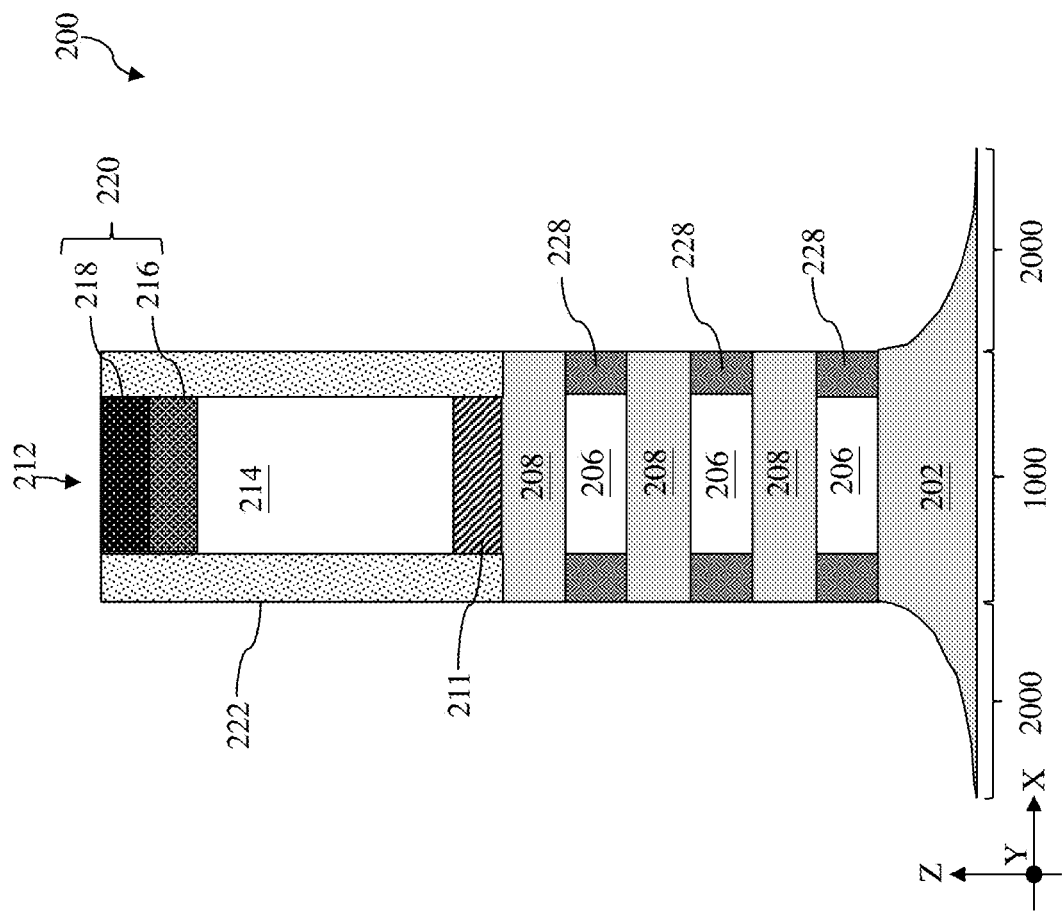

Referring to FIGS. 1 and 8, the method 100 includes a block 116 where the inner spacer layer 228 is pulled back. In some embodiments, the inner spacer layer 228 (or the treated inner spacer layer 228) is isotropically and selectively etched back until the sidewalls of the gate spacers 222 and sidewalls of the channel layers 208 are exposed. That is, until the treated inner spacer layer 228 over the sidewalls of the gate spacers 222 and sidewalls of the channel layers 208 is substantially removed. In some implementations, the isotropic etch performed at block 118 may include use of dry etchants such as hydrogen fluoride, fluorine gas, hydrogen, ammonia, nitrogen trifluoride, or other fluorine-based etchants, or wet etchants such as diluted hydrofluoric acid (dHF). Because the composition and structure of the inner spacer layer 228 is different from those of the gate spacers 222 and the channel layers 208, the pull-back operations at block 116 may be performed using an etchant and an etch process that are selective to the treated inner spacer layer 228. The etching selectivity allows the inner spacer layer 228 to be selectively etched back while the gate spacers 222 and the channel layers 208 experience slower etch rates. In some implementations where the gate spacer 222 is formed of silicon oxycarbide and dHF with a dilution ratio between about 100:1 and about 500:1 is used for the pull-back process at block 116, the etch selectivity of the inner spacer layer 228 to the gate spacers 222 may be between about 80 and about 120. In some other implementations where the gate spacer 222 is formed of silicon oxycarbide and plasma of hydrofluoric acid (HF) and ammonia ($NH_3$) are used for the pull-back process at block 116, the etch selectivity of the inner spacer layer 228 to the gate spacer 222 and is between about 1.8 and about 3.5. The etch selectivity of the inner spacer layer 228 may be due to the low density and high specific surface area as a result of its porous structure. In some embodiments represented in FIG. 8, the inner spacer layer 228 deposited within the inner spacer recesses 226 is etched such that an outer surface of the inner spacer layer 228 is coplanar with the sidewalls of the gate spacers 222. However, the present disclosure is not so limited and embodiments where the outer surface of the inner spacer layer 228 is not coplanar (for example, recessed from) with the sidewalls of the gate spacers 222 are fully envisioned. The separate portions of the inner spacer layer 228 that remain in the inner spacer recesses 226 may be referred to as inner spacer features 228 herein.

Figure 9:
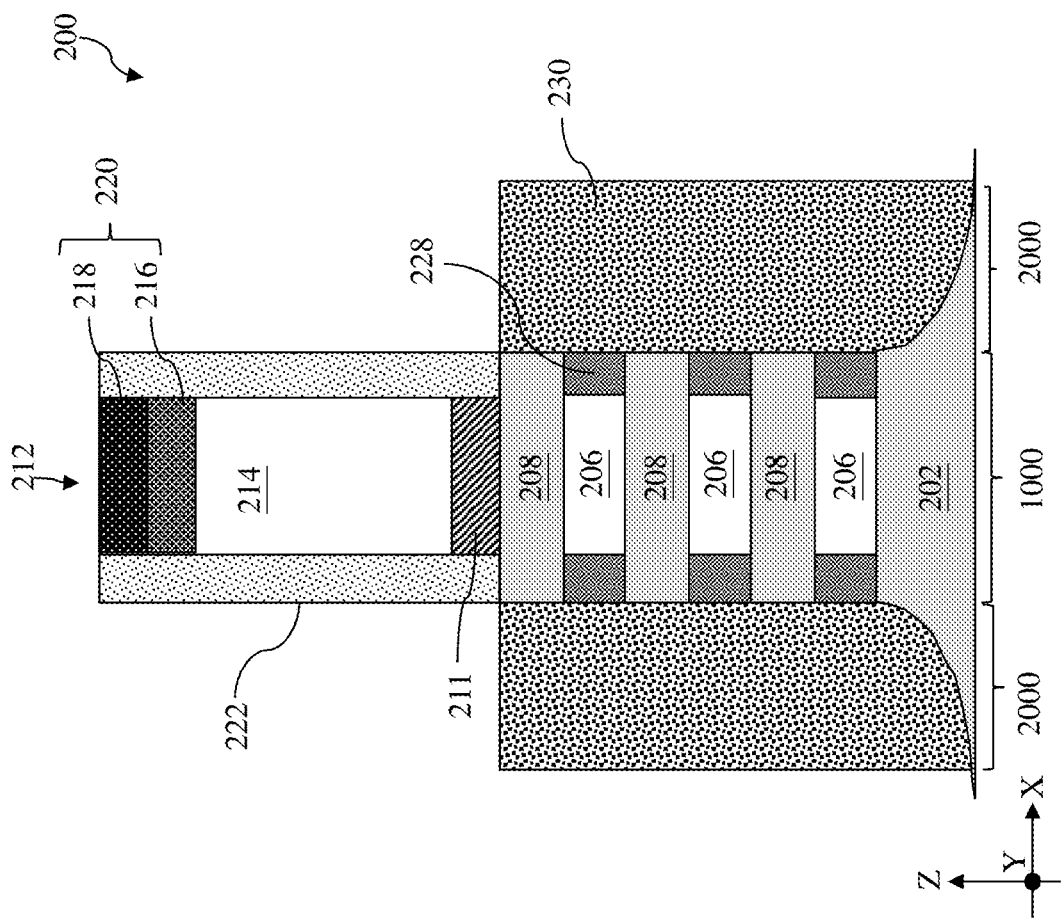

Referring to FIGS. 1 and 9, the method 100 includes a block 118 where epitaxial source/drain features 230 are formed over the source/drain regions 2000 of the fin elements 210. During the epitaxial growth process, the dummy gate stack 212 and gate spacers 222 may limit growth of the epitaxial source/drain features 230 to the source/drain regions 2000 of the fin elements 210. In some instances where dielectric fins are formed, the dielectric fins may serve to prevent epitaxial source/drain features 230 formed from different fin elements 210 from touching one another. In alternative embodiments where the dielectric fins are not present, the epitaxial source/drain features 230 of adjacent fin elements 210 may be allowed to merge if such merger does not cause failure of the semiconductor device. Suitable epitaxial processes include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process may use gaseous and/or liquid precursors, which interact with the composition of the substrate 202 as well as the channel layers 208. In the embodiments represented in FIG. 9, the epitaxial source/drain features 230 are in direct contact with the channel layers 208 and the portions of the substrate 202 exposed in the source/drain trench 224 (FIG. 5). In those embodiments, the epitaxial source/drain features 230 are not in direct contact with the sacrificial layers 206. Instead, the epitaxial source/drain features 230 are in direct contact with the inner spacer layer 228 deposited in the inner spacer recesses 226.

In various embodiments, the epitaxial source/drain features 230 may include Ge, Si, GaAs, AlGaAs, SiGe, GaAsP, SiP, or other suitable material. The epitaxial source/drain features 230 may be in-situ doped during the epitaxial process by introducing doping species including: p-type dopants, such as boron or $BF_2$; n-type dopants, such as phosphorus or arsenic; and/or other suitable dopants including combinations thereof. If the epitaxial source/drain features 230 are not in-situ doped, an implantation process (i.e., a junction implant process) is performed to dope the epitaxial source/drain features 230. In an exemplary embodiment, the epitaxial source/drain features 230 in an NMOS device include SiP, while those in a PMOS device include SiGeB. In some implementations, epitaxial source/drain features 230 for NMOS and PMOS devices are formed separately to have different epitaxial source/drain features 230 for NMOS and PMOS devices.

Furthermore, silicidation or germano-silicidation may be formed on the epitaxial source/drain features 230. For example, silicidation, such as nickel silicide, titanium silicide, tantalum silicide, or tungsten silicide, may be formed by depositing a metal layer over the epitaxial source/drain features 230 and annealing the metal layer such that the metal layer reacts with silicon in the epitaxial source/drain features 230 to form the metal silicidation. The unreacted metal layer may be removed.

Figure 10:
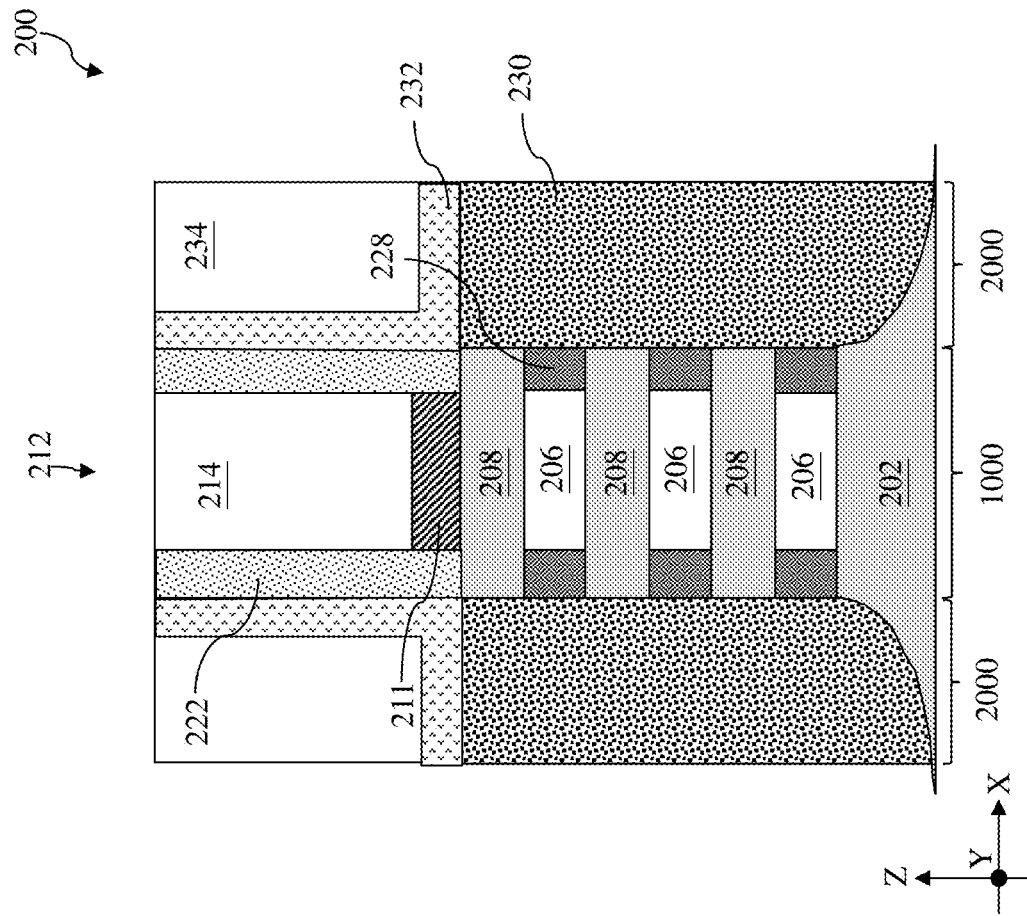

Referring to FIGS. 1 and 10, the method 100 includes a block 120 where an interlayer dielectric (ILD) layer 234 is formed. In some embodiments, a contact etch stop layer (CESL) 232 may be formed prior to forming the ILD layer 234. In some examples, the CESL 232 includes a silicon nitride layer, a silicon oxide layer, a silicon oxynitride layer, and/or other materials known in the art. The CESL 232 may be formed by ALD, plasma-enhanced chemical vapor deposition (PECVD) process and/or other suitable deposition or oxidation processes. In some embodiments, the ILD layer 234 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 234 may be deposited by a PECVD process or other suitable deposition technique. In some embodiments, after formation of the ILD layer 234, the workpiece 200 may be annealed to improve integrity of the ILD layer 234. In some implementations, after depositing the ILD layer 234, a planarization process may be performed to remove excessive dielectric materials. For example, a planarization process includes a chemical mechanical planarization (CMP) process which removes portions of the ILD layer 234 (and CESL 232, if present) overlying the dummy gate stack 212 and planarizes a top surface of the workpiece 200. In some embodiments represented in FIG. 10, the CMP process also removes hard mask 220 and exposes the dummy electrode layer 214.

Figure 11:
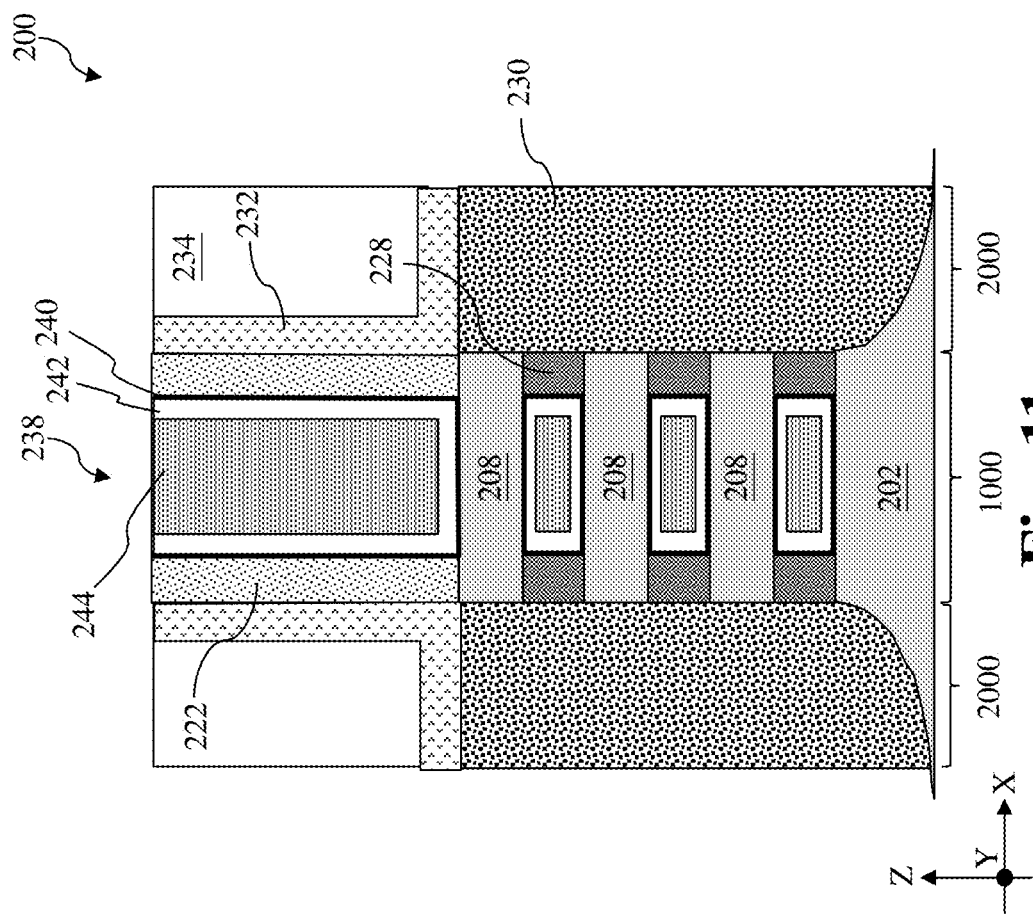

Referring to FIGS. 1 and 11, the method 100 includes a block 122 where the dummy gate stack 212 is removed. In some embodiments, the removal of the dummy gate stacks 212 results in gate trenches defined between gate spacers 222 over the channel regions 1000. A final high-k gate structure (e.g., including a high-K dielectric layer and metal gate electrode) may be subsequently formed in the gate trench, as will be described below. Block 122 may include one or more etching processes that are selective to the material in the dummy gate stack 212. For example, the removal of the dummy gate stack 212 may be performed using as a selective wet etch, a selective dry etch, or a combination thereof that is selective to the dummy electrode layer 214. Upon conclusion of the operations at block 122, the epitaxial layers 206 and 208 of the fin element 210 are exposed in the gate trench.

Referring still to FIGS. 1 and 11, the method 100 includes a block 124 where the channel members 208 are released. Operations of block 124 remove the sacrificial layers 206 between inner spacer features 228 and the channel layers 208 in the channel regions 1000 are vertically spaced apart by the thickness of each of the sacrificial layer 206. The selective removal of the sacrificial layers 206 releases the channel layers 208 to be channel members 208. It is noted that the same reference numeral 208 is used to denote channel members 208 for simplicity. Block 122 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a silicon germanium oxide removal process. For example, the oxidation may be provided by ozone clean and then silicon germanium oxide removed by an etchant such as $NH_4OH$.

Referring still to FIGS. 1 and 11, the method 100 includes a block 126 where the metal gate stack 238 is formed in the channel region 1000 to wrap around the channel members 208. The metal gate stack 238 may be a high-K metal gate stack, however other compositions are possible. In some embodiments, the metal gate stack 238 is formed within the gate trenches over the workpiece 200 and is deposited in the space left behind by the removal of the sacrificial layers 206. In this regard, the metal gate stack 238 wraps around each of the channel members 208 in each of the fin elements 210. In various embodiments, the metal gate stack 238 (or high-K metal gate stack 238) includes an interfacial layer 240, a high-K gate dielectric layer 242 formed over the interfacial layer 240, and/or a gate electrode layer 244 formed over the high-K gate dielectric layer 242. The high-k gate dielectric layer 242 is formed of a high-K dielectric material having a dielectric constant, for example, greater than that of thermal silicon oxide (~3.9). The gate electrode layer 244 used within the metal gate stack 238 may include a metal, metal alloy, or metal silicide. Additionally, the formation of the metal gate stack 238 may include depositions to form various gate materials, one or more liner layers, and one or more CMP processes to remove excessive gate materials and thereby planarize a top surface of the workpiece 200.

In some embodiments, the interfacial layer 240 may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer 242 of the metal gate stack 238 may include a high-K dielectric layer such as hafnium oxide. Alternatively, the high-K gate dielectric layer 242 may include other high-K dielectrics, such as $TiO_2$, HfZrO, $Ta_2$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 242 may be formed by ALD, physical vapor deposition (PVD), CVD, oxidation, and/or other suitable methods.

The gate electrode layer 244 of the metal gate stack 238 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 244 of metal gate stack 238 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer 244 of the metal gate stack 238 may be formed by ALD, PVD, CVD, e-beam evaporation, or other suitable process. Further, the gate electrode layer 244 may be formed separately for N-FET and P-FET transistors which may use different metal layers (e.g., for providing different N-type and P-type work function metal layers). In various embodiments, a CMP process may be performed to remove excessive metal from the gate electrode layer 244 of the metal gate stack 238, and thereby provide a substantially planar top surface of the metal gate stack 238. The metal gate stack 238 includes portions that interpose between channel members 208 in the channel regions 1000.

Figure 12:
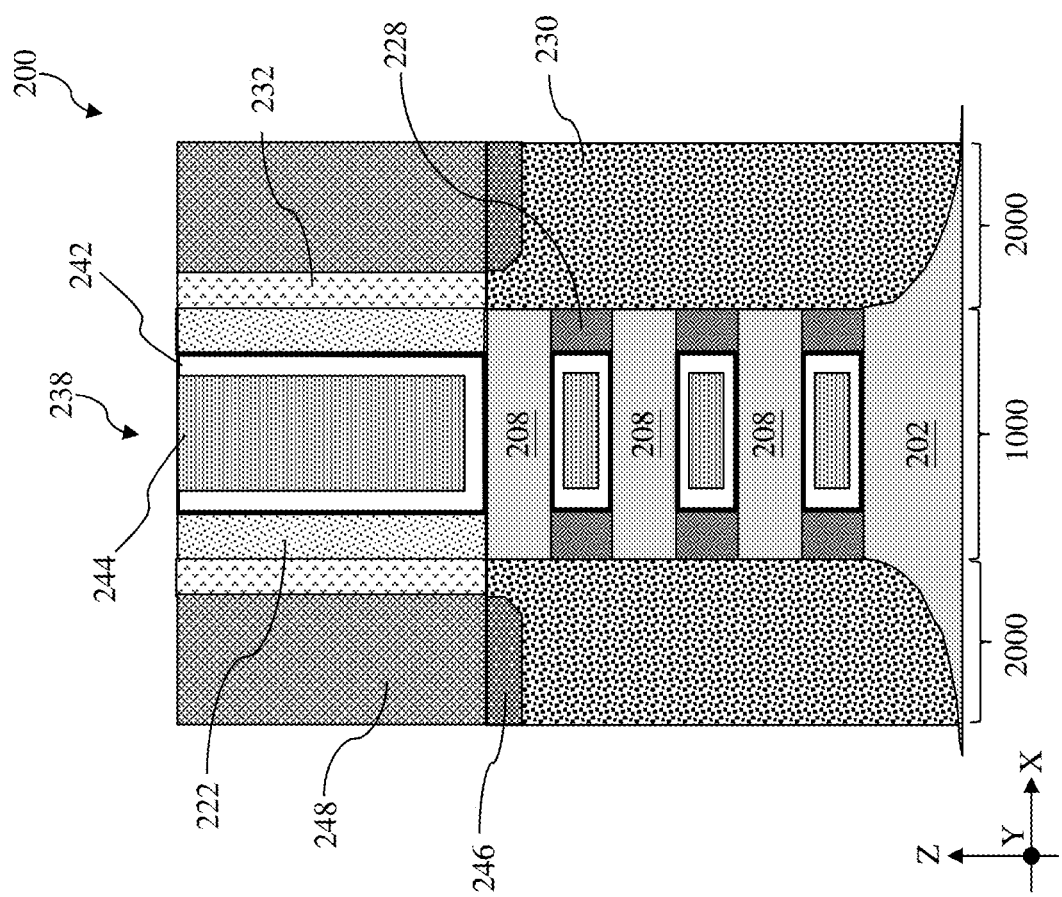

Referring to FIGS. 1 and 12, the method 100 includes a block 128 where further processes are performed. The workpiece 200 may undergo further processes to form the semiconductor device 200. Such further processes may include, for example, formation of source/drain contacts 248. In this example, openings for the source/drain contacts 248 are formed through the ILD layer 234 and a metal fill layer is formed in the openings. In some embodiments, a silicide layer 246 may be formed between the source/drain contact 248 and the epitaxial source/drain feature 230 to reduce contact resistance. The source/drain contacts 248 and the gate contacts (not shown) allow the GAA transistors formed in method 100 to be electrically coupled to a multilayer interconnect structure that includes multiple contact vias and metal line layers in one or more intermetal dielectric layers. The multilayer interconnect structure is configured to connect various multi-gate devices, memory devices, input/output devices, power-gate devices, passive devices, and other devices to form a functional circuit.

Although not intended to be limiting, embodiments of the present disclosure provide benefits to a semiconductor device and the formation process thereof. For example, embodiments of the present disclosure provide an inner spacer feature that is formed of porous dielectric material that include silicon and nitrogen. The inner spacer feature of the present disclosure includes a lower dielectric constant as compared to conventional inner spacer features to improve performance of the semiconductor device and an improved etch selectivity with respect to the gate spacers to enlarge the process window to form the inner spacer features. Furthermore, the inner spacer feature formation process disclosed in the present disclosure can be easily integrated into existing semiconductor fabrication processes.

In one exemplary aspect, the present disclosure is directed to a semiconductor device. The semiconductor device includes a first semiconductor channel member and a second semiconductor channel member over the first semiconductor channel member, and a porous dielectric feature including silicon and nitrogen. The porous dielectric feature is sandwiched between the first and second semiconductor channel members and a density of the porous dielectric feature is smaller than a density of silicon nitride.

In some embodiments, a dielectric constant of the porous dielectric feature is between about 4.9 and about 5.2. In some implementations, the density of the porous dielectric feature is between about 2.1 g/cm$^3$ and about 2.3 g/cm$^3$. In some embodiments, a nitrogen content of the porous dielectric feature is between about 30% and about 40%. In some instances, the porous dielectric feature further includes carbon. In some implementations, a carbon content of the porous dielectric feature is between about 3% and about 8%.

In another exemplary aspect, the present disclosure is directed to a method of fabricating a semiconductor device. The method includes providing a fin element that includes a plurality of first semiconductor layers interleaved by a plurality of second semiconductor layers, forming a dummy gate structure over a channel region of the fin element, etching a source/drain region of the fin element to expose sidewalls of the plurality of first semiconductor layers and sidewalls of the plurality of second semiconductor layers, selectively and partially recessing exposed sidewalls of the plurality of second semiconductor layers to form a plurality of recesses, depositing an inner spacer layer over the plurality of recesses using an organosilane precursor and a nitrogen-containing gas, treating the inner spacer layer, and etching back the inner spacer layer.

In some embodiments, the depositing of the inner spacer layer includes depositing the inner spacer layer using atomic layer deposition. In some implementations, the organosilane precursor has a chemical formula $Si(CH_2)SiR_xCl_y$, wherein a sum of x and y (x+y) is equal to 6. In some implementations, the organosilane precursor has a chemical formula $Si(CH_2)_2SiR_xCl_y$, wherein a sum of x and y (x+y) is equal to 4. In some instances, the organosilane precursor has a chemical formula $Si(CH_3)_xCl_y$, wherein a sum of x and y (x+y) is equal to 4. In some embodiments, the organosilane precursor has a chemical formula $Si(CH_2)_2Si(CH_3)_xCl_y$, wherein x is at least 2 and a sum of x and y (x+y) is equal to 6. In some implementations, the organosilane precursor has a chemical formula $SiH_x(R1)_y(R2)_z$, wherein R1 is a methyl group, R2 includes a methylamino group or a dimethylamino group, x is at least 1, z is at least 1, and a sum of x, y and z (x+y+z) is equal to 4. In some instances, the treating of the inner spacer layer includes an anneal process, an ultraviolet (UV) curing process, or a plasma treatment process.

In yet another exemplary aspect, the present disclosure is directed to a method of fabricating a semiconductor device. The method includes providing a fin element that includes a plurality of first semiconductor layers interleaved by a plurality of second semiconductor layers, forming a dummy gate structure over a channel region of the fin element, etching a source/drain region of the fin element to expose sidewalls of the plurality of first semiconductor layers and sidewalls of the plurality of second semiconductor layers, selectively and partially recessing exposed sidewalls of the plurality of second semiconductor layers to form a plurality of recesses, depositing an inner spacer layer including silicon and nitrogen, treating the inner spacer layer, and etching back the inner spacer layer to form a porous silicon nitride layer that is less dense than silicon nitride.

In some implementations, the depositing of the inner spacer layer includes using a precursor and a molecule of the precursor includes silicon and at least one alkyl group. In some embodiments, the molecule of the precursor further includes nitrogen or a halide group. In some instances, the treating of the inner spacer layer includes annealing the inner spacer layer at a temperature between about 350° C. and about 700° C. in an ambient including helium, argon, nitrogen, hydrogen, or a combination thereof. In some implementations, the treating of the inner spacer layer includes irradiating the inner spacer layer with an ultraviolet (UV) radiation at a temperature between about 150° C. and about 450° C. in an ambient including helium, argon, or nitrogen. In some instances, the treating of the inner spacer layer includes contacting the inner spacer layer with a remotely generated plasma including helium, hydrogen, nitrogen, or argon at a temperature between room temperature and about 350° C.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming over a substrate a stack that includes a plurality of first semiconductor layers vertically interleaved by a plurality of second semiconductor layers;
   patterning the stack to form a fin-shaped structure comprising a channel region sandwiched between two source/drain regions;
   forming a dummy gate stack over the channel region of the fin-shaped structure;
   depositing a gate spacer layer over the dummy gate stack;
   anisotropically recessing the two source/drain regions to form two source/drain trenches;
   partially and selectively etching sidewalls of the plurality of second semiconductor layers to form inner spacer recesses;
   depositing an inner spacer layer over the gate spacer layer, the inner spacer recesses, and sidewalls of the plurality of first semiconductor layers;
   after the depositing of the inner spacer layer, treating the inner spacer layer; and
   etching back the inner spacer layer to form inner spacer features in the inner spacer recesses.

2. The method of claim 1,
   wherein the plurality of first semiconductor layers comprise silicon (Si),
   wherein the plurality of second semiconductor layers comprise silicon germanium (SiGe).

3. The method of claim 1, wherein the forming of the dummy gate stack comprises:
   forming a dummy dielectric layer over the fin-shaped structure;
   depositing a dummy electrode layer over the dummy dielectric layer;
   depositing a hard mask layer over the dummy electrode layer; and
   patterning the hard mask layer, the dummy electrode layer and the dummy dielectric layer to form the dummy gate stack.

4. The method of claim 3, wherein the depositing of the inner spacer layer comprises depositing the inner spacer layer on a top surface of the hard mask layer.

5. The method of claim 1, wherein the depositing of the inner spacer layer comprises use of atomic layer deposition (ALD).

6. The method of claim 5, wherein the depositing of the inner spacer layer comprises use of an organosilane precursor and a nitrogen-containing gas.

7. The method of claim 6, wherein the nitrogen-containing gas comprises ammonia or nitrogen.

8. The method of claim 6,
   wherein the organosilane precursor has a chemical formula $Si(CH_2)SiR_xCl_y$,
   wherein a sum of x and y (x+y) is equal to 6.

9. The method of claim 6,
   wherein the organosilane precursor has a chemical formula $Si(CH_2)_2SiR_xCl_y$,
   wherein a sum of x and y (x+y) is equal to 4.

10. The method of claim 6,
    wherein the organosilane precursor has a chemical formula $Si(CH_3)_xCl_y$,
    wherein a sum of x and y (x+y) is equal to 4.

11. The method of claim 6,
    wherein the organosilane precursor has a chemical formula $Si\ (CH_2)_2Si(CH_3)_xCl_y$,
    wherein x is at least 2,
    wherein a sum of x and y (x+y) is equal to 6.

12. A method, comprising:
    forming, over a substrate, an epitaxial stack comprising a plurality of channel layers interleaved by a plurality of sacrificial layers;
    patterning the epitaxial stack and a portion of the substrate to form a fin-shaped structure;
    forming a dummy gate structure over a channel region of the fin-shaped structure;
    etching a source/drain region of the fin-shaped structure to expose sidewalls of the plurality of channel layers and sidewalls of the plurality of sacrificial layers;

selectively and partially recessing exposed sidewalls of the plurality of sacrificial layers to form a plurality of recesses;
depositing an inner spacer layer over the plurality of recesses using an organosilane precursor and a nitrogen-containing gas;
treating the inner spacer layer;
etching back the inner spacer layer;
forming a source/drain feature in the source/drain region;
depositing a dielectric layer over the source/drain feature;
removing the dummy gate structure;
selectively removing the plurality of sacrificial layers in the channel region to release the plurality of channel layers as channel members; and
forming a gate structure to wrap around each of the plurality of channel layers.

13. The method of claim 12, further comprising:
depositing an isolation feature over the substrate to surround a lower portion of the fin-shaped structure,
wherein a portion of the dummy gate structure is disposed over the isolation feature.

14. The method of claim 12, wherein the etching of the source/drain region of the fin-shaped structure comprises partially etching into the substrate.

15. The method of claim 12, further comprising:
before the etching of the source/drain region, depositing a gate spacer layer over the dummy gate structure; and
anisotropically etching back the gate spacer layer.

16. The method of claim 12, wherein the nitrogen-containing gas comprises ammonia or nitrogen.

17. A method, comprising:
forming, over a substrate, an epitaxial stack comprising a plurality of channel layers interleaved by a plurality of sacrificial layers;
patterning the epitaxial stack and a portion of the substrate to form a fin-shaped structure;
depositing an isolation feature over the substrate to surround a lower portion of the fin-shaped structure,
forming a dummy gate structure over a channel region of the fin-shaped structure;
etching a source/drain region of the fin-shaped structure to expose sidewalls of the plurality of channel layers and sidewalls of the plurality of sacrificial layers;
selectively and partially recessing exposed sidewalls of the plurality of sacrificial layers to form a plurality of recesses;
depositing, by using an atomic layer deposition (ALD) process, an inner spacer layer over the plurality of recesses using an organosilane precursor and a nitrogen-containing gas;
treating the inner spacer layer;
etching back the inner spacer layer;
forming a source/drain feature in the source/drain region;
depositing a dielectric layer over the source/drain feature;
removing the dummy gate structure;
selectively removing the plurality of sacrificial layers in the channel region to release the plurality of channel layers as channel members; and
forming a gate structure to wrap around each of the plurality of channel layers.

18. The method of claim 17, wherein the depositing of the inner spacer layer comprises a process temperature between about 150° C. and about 650° C.

19. The method of claim 17, wherein the depositing of the inner spacer layer is free of use of oxygen or oxidizers.

20. The method of claim 17, wherein the nitrogen-containing gas comprises ammonia or nitrogen.

\* \* \* \* \*